(12) United States Patent
Enzmann et al.

(10) Patent No.: US 11,456,404 B2
(45) Date of Patent: Sep. 27, 2022

(54) OPTOELECTRONIC SEMICONDUCTOR CHIP

(71) Applicant: OSRAM OLED GmbH, Regensburg (DE)

(72) Inventors: Roland Heinrich Enzmann, Gelugor (MY); Lorenzo Zini, Regensburg (DE); Vanessa Eichinger, Wenzenbach (DE); Stefan Barthel, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 94 days.

(21) Appl. No.: 16/758,401

(22) PCT Filed: Oct. 25, 2018

(86) PCT No.: PCT/EP2018/079320
§ 371 (c)(1),
(2) Date: Apr. 23, 2020

(87) PCT Pub. No.: WO2019/081658
PCT Pub. Date: May 2, 2019

(65) Prior Publication Data
US 2020/0251639 A1    Aug. 6, 2020

(30) Foreign Application Priority Data
Oct. 26, 2017   (DE) .................. 10 2017 125 105.7

(51) Int. Cl.
*H01L 33/62* (2010.01)
*H01L 33/38* (2010.01)

(52) U.S. Cl.
CPC ............ *H01L 33/62* (2013.01); *H01L 33/382* (2013.01)

(58) Field of Classification Search
CPC ....... H01L 33/62; H01L 33/382; H01L 33/38; H01L 33/387; H01L 33/36
See application file for complete search history.

(56) References Cited

U.S. PATENT DOCUMENTS

| 9,559,254 | B2 * | 1/2017 | Jeong ...................... H01L 33/08 |
| 2010/0171135 | A1 * | 7/2010 | Engl ....................... H01L 33/58 |
| | | | 257/98 |

(Continued)

FOREIGN PATENT DOCUMENTS

| DE | 102007022947 A1 | 10/2008 |
| DE | 102008011848 A1 | 9/2009 |

(Continued)

OTHER PUBLICATIONS

German Search Report based on Application No. 10 2017 125 105.7, dated Jun. 15, 2018, 8 pages (for reference purpose only).

(Continued)

*Primary Examiner* — Su C Kim
(74) *Attorney, Agent, or Firm* — Viering, Jentschura & Partner mbB

(57) ABSTRACT

An optoelectronic semiconductor chip may include a semiconductor body, a first and second contact element, a chip carrier, an electrically conductive contact layer, an electrically conductive supply layer, an insulating layer between the contact layer and the supply layer, and at least one electrically conductive feed-through element embedded in the insulating layer. The feed-through element(s) may electrically connect the supply layer to the contact layer. A quantity and/or size of the feed-through elements may be greater on a second side of the semiconductor body opposite to the first side than on the first side.

18 Claims, 6 Drawing Sheets

(56) References Cited

U.S. PATENT DOCUMENTS

| | | |
|---|---|---|
| 2012/0086026 A1 | 4/2012 | Engl et al. |
| 2013/0221392 A1 | 8/2013 | Engl et al. |
| 2014/0306247 A1* | 10/2014 | Lee .................. H01L 33/60 257/88 |
| 2015/0255685 A1 | 9/2015 | Herrmann et al. |
| 2016/0247971 A1* | 8/2016 | Lee .................. H01L 33/382 |
| 2016/0351758 A1 | 12/2016 | Herrmann et al. |
| 2018/0301597 A1 | 10/2018 | Park et al. |
| 2019/0027654 A1* | 1/2019 | Hoppel .............. H01L 31/1852 |

FOREIGN PATENT DOCUMENTS

| | | |
|---|---|---|
| DE | 102012217533 A1 | 3/2014 |
| DE | 102014101492 A1 | 8/2015 |
| JP | H06296041 A | 10/1994 |
| WO | 2016190665 A1 | 12/2016 |

OTHER PUBLICATIONS

International Search Report based on Application No. PCT/EP2018/079320, dated Feb. 1, 2019, 13 pages (for reference purpose only).

* cited by examiner

OPTOELECTRONIC SEMICONDUCTOR CHIP

CROSS-REFERENCE TO RELATED APPLICATIONS

The present application is a national stage entry according to 35 U.S.C. § 371 of PCT application No.: PCT/EP2018/079320 filed on Oct. 25, 2018; which claims priority to German Patent Application Serial No.: 10 2017 125 105.7 filed on Oct. 26, 2017; all of which are incorporated herein by reference in their entirety and for all purposes.

TECHNICAL FIELD

An optoelectronic semiconductor chip is specified, which has a semiconductor body and contact elements for electrically contacting the semiconductor body, which are arranged on the side of the semiconductor body, in particular, on the same side of the semiconductor body.

BACKGROUND

In such a semiconductor chip, especially if the current is injected into the semiconductor body by means of a relatively thin contact layer, the problem of so-called "current crowding" can occur, which means that an inhomogeneous current density distribution exists in the vicinity of the contact elements, in particular in the region of a p-type contact element. When this occurs the current density near the p-contact element is relatively high. In the case of a radiation-emitting semiconductor chip, the inhomogeneous current density distribution results in the intensity of the emitted radiation varying across the semiconductor chip. The temperature can also vary across the semiconductor chip. The resulting current density and temperature peaks that occur can lead to a disproportionately severe degradation of the semiconductor body.

It would be desirable to specify an optoelectronic semiconductor chip with a relatively homogeneous current density distribution. This object is achieved by, among other things, an optoelectronic semiconductor chip having the features of the independent subject claim.

SUMMARY

In accordance with at least one embodiment, the optoelectronic semiconductor chip comprises a semiconductor body with a first semiconductor region and a second semiconductor region. Furthermore, the semiconductor body has a first main surface and a second main surface opposite the first main surface, wherein, in particular, the first main surface is formed by a surface of the first semiconductor region and the second main surface is formed by a surface of the second semiconductor region. In particular, the first main surface and the second main surface form the boundaries of the semiconductor body in a vertical direction.

Furthermore, the semiconductor body has at least one side surface, which connects the first main surface to the second main surface. The number of side surfaces is determined by the geometry of the semiconductor body. For example, the semiconductor body can have a geometric shape that approximates to a frustum of a pyramid. In this case, the semiconductor body has a plurality of side surfaces. The at least one side surface is largely transverse to the first and second main surface. "Transverse" means that a normal vector of the side surface does not run parallel to a normal vector of the first and/or second main surface. The at least one side surface bounds the semiconductor body in one or more lateral directions. The lateral directions are arranged in a plane whose normal vector is arranged parallel to a vertical direction. In particular, the vertical direction designates the direction in which the second semiconductor region follows the first semiconductor region.

Furthermore, the at least one side surface can be a surface composed of at least two partial surfaces. For example, the partial surfaces can be planar surfaces, whose surface normals run transverse, which means not parallel, to each other.

The first semiconductor region can have a first conductivity and the second semiconductor region a second conductivity. In addition, the first semiconductor region is a p-type conducting region. In addition, the second semiconductor region is an n-type conducting region. The first and second semiconductor regions can each have a layer sequence. In this case it is possible that the first semiconductor region and the second semiconductor region contain one or more undoped layers in addition to doped layers.

The first and second semiconductor regions can be produced in layers one after the other on a growth substrate by means of an epitaxial procedure, wherein the second semiconductor region is applied to the growth substrate and then the first semiconductor region is applied to the second semiconductor region. Suitable materials for the growth substrate, for example, can be sapphire, SiC and/or GaN. The growth substrate can be at least partially removed after the manufacture of the semiconductor body so that the second main surface or a surface of the second semiconductor region is at least partially exposed.

The semiconductor body advantageously has an active zone, which is suitable for radiation generation or radiation detection. In particular, the active zone is a p-n junction zone. The active zone can then be formed as one layer or as a layer sequence consisting of a plurality of layers. For example, in the operation of the semiconductor chip, the active zone emits electromagnetic radiation, for example in the visible, ultraviolet or infra-red spectral range. Alternatively, in the operation of the semiconductor chip, the active zone can absorb electromagnetic radiation and convert it into electrical signals or electrical energy. The active zone is arranged in particular between the first semiconductor region and the second semiconductor region. A significant proportion of the radiation produced or absorbed by the active zone passes through the second main surface of the semiconductor body. Advantageously, the second main surface is uncovered by the contact elements arranged on the side of the semiconductor body, so that they cannot cause radiation losses at the second main surface.

The layers of the semiconductor body contain at least one III-V semiconductor material, such as a material from the material systems $In_xGa_yAl_{1-x-y}P$, $In_xGa_yAl_{1-x-y}N$ or $In_xGa_yAl_{1-x-y}As$, in each case with $0 \leq x$, $y \leq 1$ and $x+y \leq 1$. III-V semiconductor materials are particularly suitable for generating radiation in the ultraviolet ($In_xGa_yAl_{1-x-y}N$), across the visible ($In_xGa_yAl_{1-x-y}N$, in particular for blue to green radiation, or $In_xGa_yAl_{1-x-y}P$, in particular for yellow to red radiation) and into the infra-red ($In_xGa_yAl_{1-x-y}As$) spectral range.

Furthermore, in accordance with at least one embodiment, the semiconductor chip has a first and second contact element, which are provided for electrically contacting the semiconductor body. The contact elements are, in particular, electrically conductive layers arranged outside the semiconductor body, which can be electrically contacted from the outside, for example by means of bond wires. In this case, the first contact element can form a p-type contact and the second contact element an n-type contact.

In addition, in accordance with a non-limiting embodiment, the semiconductor chip also comprises a chip carrier. The chip carrier can be a substrate, which is different to the growth substrate used for producing the semiconductor body. The chip carrier advantageously contains a material with high thermal conductivity, such as a metal, a semiconductor material, or a ceramic material. The chip carrier can be electrically conducting or electrically insulating. Suitable materials for the chip carrier are, for example, Si3N4 and AlN.

The semiconductor body and the first and the second contact element are arranged side by side on the chip carrier. In other words, the three elements are arranged laterally and no more than partially overlapping. Furthermore, the first and second contact element are arranged on a first side of the semiconductor body. This allows a plurality of such semiconductor chips to be strung together and easily electrically contacted at their edges. The different sides of the semiconductor body are defined, in particular, by the various lateral surfaces of the semiconductor body.

Furthermore, in a non-limiting embodiment, the semiconductor chip has an electrically conducting contact layer which is arranged on the first main surface of the semiconductor body, facing the chip carrier. The contact layer is made of an electrically conductive and, in particular, highly reflective material, for example a metal such as silver or aluminum, or an electrically conductive oxide, such as ZnO. The contact layer can be formed from a layer sequence consisting of metal layers and conductive oxide layers. A thickness of the contact layer is between 100 nm inclusive and 500 nm inclusive. The "thickness" in this case refers, in particular, to a maximum vertical extent of the layer.

In a design, the contact layer is a contiguous layer. This means that all regions of the contact layer are connected to each other. This is particularly advantageous in relation to the current supply to the semiconductor body by means of the contact layer. Furthermore, the contact layer has a homogeneous thickness. "Homogeneous" here means that thickness variations in the contact layer amount to a maximum of 20% of a mean value.

Furthermore, in a non-limiting embodiment, the semiconductor chip has an electrically conducting supply layer, which is arranged on a side of the contact layer facing away from the semiconductor body and is connected to the first contact element. In particular, the supply layer is electrically conductively connected to the first contact element and is directly adjacent thereto. The supply layer can be formed of an electrically conductive material, for example from a metal such as Au. The thickness of the supply layer has a value between 200 nm inclusive and 1 µm inclusive. In particular, the supply layer can be formed thicker than the contact layer.

In a non-limiting design, the supply layer is a contiguous layer. This means that all regions of the supply layer are connected to each other. In addition, the supply layer can have a largely homogeneous thickness. For example, the supply layer can be formed thicker in the vicinity of the first contact element than in regions covered by the semiconductor body.

According to a non-limiting embodiment, the semiconductor chip has an insulation layer which is arranged between the contact layer and the supply layer. By means of the insulation layer, the contact layer is electrically insulated from the supply layer. Suitable materials for the insulation layer are weakly electrically conducting or non-conducting materials, in particular silicon oxides or silicon nitrides. The thickness of the insulation layer has a value between 200 nm inclusive and 2 µm inclusive. The insulation layer can be designed as a single layer or as multiple layers. In the case of a multi-layer insulation layer, this has at least two different types of partial layers, which are made, for example, of different materials, such as SiO2 and SiN. The thickness of a partial layer is 10 nm, wherein thickness deviations are, in particular, a maximum of 20% from a mean value.

In accordance with at least one embodiment, the semiconductor chip has at least one electrically conducting feed-through element, which is embedded in the insulation layer and electrically connects the supply layer to the contact layer. The at least one feed-through element is formed of an electrically conductive material, for example, a metal such as Au. In particular, the feed-through element can be formed of the same material as the supply layer. The feed-through element can have the geometrical shape of a cylinder or prism. In the case of multiple feed-through elements, in particular these are not formed contiguously, but separately.

According to a non-limiting embodiment, a quantity and/or size of the feed-through elements on a second side of the semiconductor body opposite the first side is greater than on the first side. The "size" refers, in particular, to the surface area of a cross section of a feed-through element which is fed through parallel to the first main surface. In the case of a single feed-through element, this is arranged on the second side of the semiconductor body. There is thus no feed-through element on the first side, so that, as a consequence, the number of the feed-through elements on the second side is larger than on the first side. In the case of multiple feed-through elements, in particular, their size increases from the first to the second side. By means of the arrangement and/or structure, in other words, in particular, the size and shape of the feed-through element, the current density distribution in the semiconductor body can be manipulated.

In particular, the at least one electrically conducting feed-through element is arranged and configured in such a way that in operation, a plurality of current paths, each with a total series resistance, exists between the first and second contact element, wherein the current paths have largely the same total series resistance. This means that the intensity of the emitted radiation is advantageously relatively constant across the semiconductor chip. In comparison to this, in a semiconductor chip in which the contact layer is energized directly rather than indirectly by means of at least one feed-through element, current paths with very different total series resistances are present, leading to the problems of inhomogeneous current injection and inhomogeneous current density distribution mentioned above.

The criterion that the current paths have largely the same total series resistance is fulfilled, in particular, when at least 50% of the current paths have a total series resistance that differs from the ideal value by no more than 10%. In particular, the semiconductor chip described in the present case has a high-current semiconductor chip, which in normal operation has a current density of at least 4 A/mm$^2$, in particular of at least 5 A/mm$^2$. Such a semiconductor chip can have a forward voltage of 4.5 V+/−2 V and a peak current of 10 A. The ideal total series resistance is therefore between 0.1 and 0.65Ω.

In this case, a current path extends from the first contact element through the supply layer, through the at least one feed-through element, through the contact layer and through the semiconductor body up to the second contact element.

The total series resistance along a current path is essentially composed of the various series resistances of the current-carrying layers or elements. In the present case the total series resistance is determined mainly by the different series resistances of the supply layer, the at least one feed-through element, the contact layer, the semiconductor body, a connection layer of the second semiconductor region and the second contact element. While the series resistances of the contact layer and the semiconductor body for the various current paths are essentially constant, the series resistances of the supply layer and the feed-through elements vary.

In operation, in particular the series resistance of the supply layer increases from the first to the second side of the semiconductor body. This situation is realized, for example, in a contiguously formed supply layer of largely homogeneous thickness between 200 nm inclusive and 3 µm inclusive.

Also, in the case of multiple feed-through elements, in operation the series resistance of the feed-through elements decreases from a first to a second side of the semiconductor body. This situation is realized, for example, when the size of the feed-through elements increases from the first to the second side. For example, the feed-through elements near to the first contact element can have a diameter, which is to say a lateral extent, from 0.2 µm inclusive to 0.5 µm inclusive and further away from the first contact element, in particular on the second side of the semiconductor body, a diameter of about 3 µm. The diameter can therefore increase by a factor of 10 from the first to the second side. In this case, the feed-through elements for a thinner supply layer are smaller than for a thicker supply layer.

In an advantageous design, the semiconductor chip has a plurality of feed-through elements which are arranged offset relative to each other in rows. In other words, the feed-through elements are arranged in a matrix-like fashion. At the same time, the size of the feed-through elements in a row increases from the first to the second side of the semiconductor body. Furthermore, the size of the feed-through elements in a region from a third to a fourth side of the semiconductor body opposite the third can be constant.

According to at least one embodiment, the semiconductor chip has a single feed-through element with a planar design, which is arranged on the second side of the semiconductor body and extends along a side edge of the semiconductor body which bounds the first main surface. In this embodiment also, the series resistance between the supply layer and the contact layer in operation decreases from the first to the second side of the semiconductor body. For example, the feed-through element can be designed in the shape of a strip. A width of the feed-through element is between 70 µm and 90 µm inclusive.

According to a further design, the optoelectronic semiconductor chip can have a plurality of strip-shaped feed-through elements, which extend from the third side to the fourth side of the semiconductor body. In other words, the strip-shaped feed-through elements are arranged in a lattice-like fashion. The width of the feed-through elements increases from the first to the second side of the semiconductor body.

In accordance with at least one embodiment, the semiconductor chip has a plurality of vias, each of which extends from the chip carrier through the supply layer, through the insulation layer, through the contact layer and the first semiconductor region and into the second semiconductor region. In this case, the vias are each arranged in openings that extend through the supply layer, through the insulation layer, through the contact layer and the first semiconductor region and into the second semiconductor region. The vias can be made from an electrically conductive material, for example from a metal such as silver.

The feed-through elements are arranged in spaces between the vias.

Furthermore, the semiconductor chip can have a connection layer, which electrically connects the second contact element to the vias. The connection layer is arranged on a side of the supply layer facing away from the semiconductor body. The thickness of the connection layer has a value, in particular, of between 500 nm inclusive and 3 µm inclusive. In a non-limiting embodiment, the connection layer is formed thicker than the supply layer. This applies in particular to regions that are covered by the semiconductor body. As a result, the fluctuations in the current density occurring on the n-side are negligibly small compared to the fluctuations present on the p-side. The connection layer is mechanically connected, in particular on the surface facing away from the supply layer, to the chip carrier.

In accordance with at least one embodiment, the semiconductor chip has a current dispersion layer arranged between the contact layer and the insulation layer, the current dispersion layer being in electrical contact with the contact layer, and in particular completely covering the same. The contact layer and the current dispersion layer can differ in terms of their material composition. The current dispersion layer can be formed from a metal, such as titanium, copper, nickel, gold, platinum, aluminum, or silver.

In an advantageous design, the current dispersion layer has an inhomogeneous thickness. Particularly in regions where the current dispersion layer is connected to a feed-through element, it has a lower thickness than in regions without a feed-through element. This can be used to prevent a vertical extent or height of the semiconductor chip being increased by the additional feed-through element.

In addition, the semiconductor chip can have a first and/or second covering layer, which are applied to the second main surface and also to the at least one side surface of the semiconductor body. In this case, the first covering layer is arranged between the semiconductor body and the second covering layer. For example, the first covering layer can contain or consist of Al2O3. The second covering layer can be an insulating layer of, for example, silicon oxide or silicon nitride or aluminum oxide, such as Al2O3. It is possible that the second covering layer contains scattering particles and/or fluorescent particles. The contact elements are not covered by the covering layers on their contacting surface provided for contacting.

BRIEF DESCRIPTION OF THE DRAWINGS

In the following, the optoelectronic semiconductor chip described herein is explained in more detail in conjunction with non-limiting embodiments and the associated figures.

Identical, similar or similar-looking elements are provided with the same reference signs in the figures. The figures and the proportions of the elements depicted in the figures relative to each other are not to be considered as true to scale. Rather, individual elements may be displayed in an exaggeratedly large format for better presentation and/or comprehensibility.

DETAILED DESCRIPTION

Figure 1:
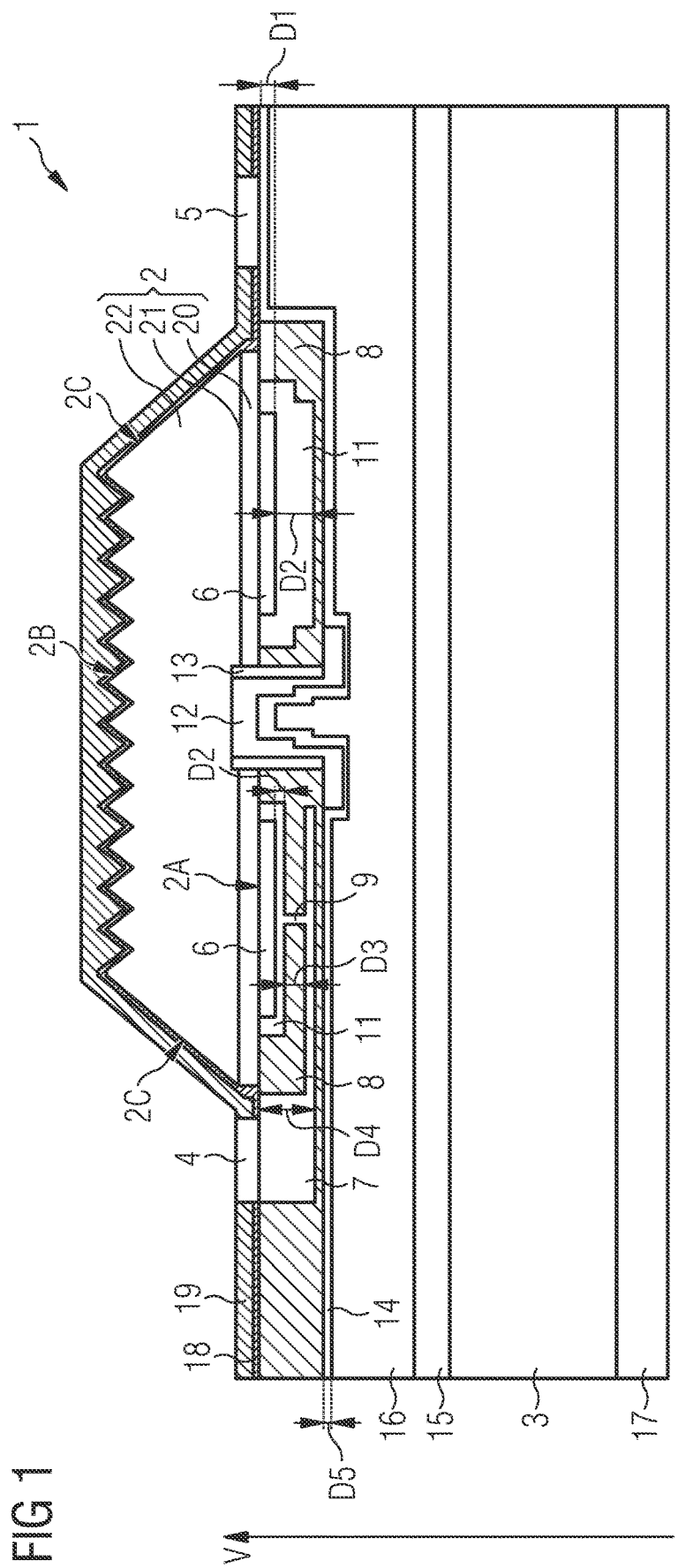
FIG. 1, a schematic sectional view and FIG. 2, a schematic plan view of an optoelectronic semiconductor chip according to a first exemplary embodiment, FIGS. 3 and 4, schematic plan views of an optoelectronic semiconductor chip in accordance with a second and third exemplary embodiment, FIG. 5, a schematic sectional view and FIG. 6, a schematic plan view of an optoelectronic semiconductor chip according to a comparison example, FIG. 7, a diagram of the current density distribution in an optoelectronic semiconductor chip in accordance with the comparison example, and FIG. 8, a diagram of the temperature distribution in an optoelectronic semiconductor chip in accordance with the comparison example.
Figure 2:
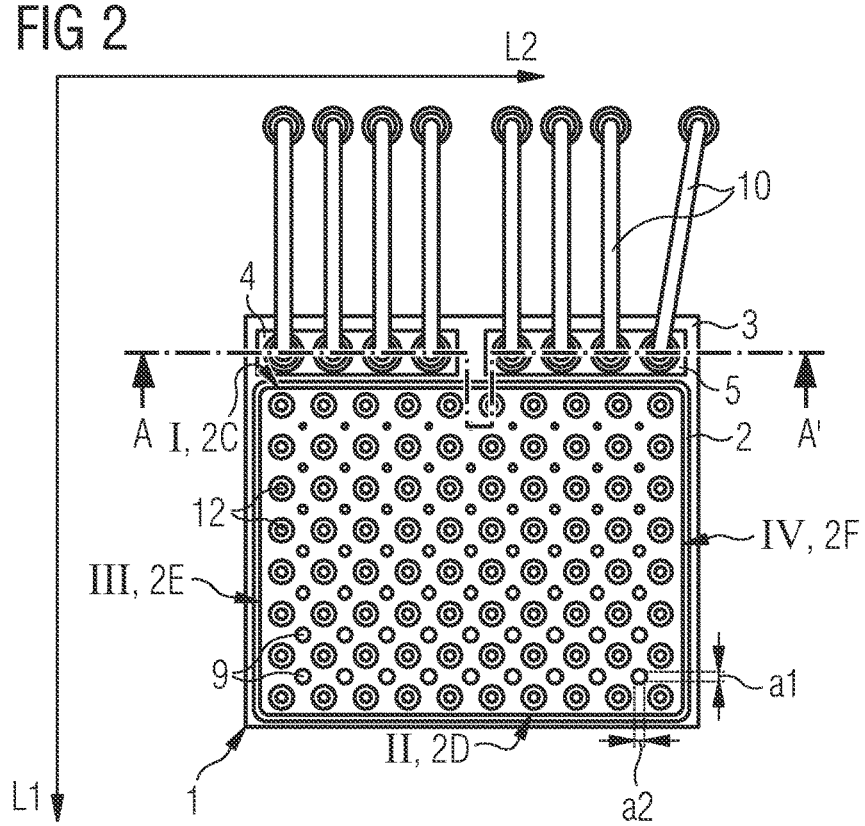

FIG. 1 shows a schematic cross-sectional view of an optoelectronic semiconductor chip 1 along a cutting surface AA' shown in FIG. 2. The semiconductor chip 1 comprises a semiconductor body 2 and a chip carrier 3, on which the semiconductor body 2 is arranged. The semiconductor chip 1 also comprises a first contact element 4 and a second contact element 5, which are provided for electrically contacting the semiconductor body 2. The semiconductor body 2 and the first and second contact element 4, 5 are arranged next to each other on the chip carrier 3, the first and second contact element 4, 5 being arranged on a first side I of the semiconductor body 2 (compare FIG. 2). The semiconductor chip 1 also comprises an electrically conducting contact layer 6, which is arranged on a first main surface 2A of the semiconductor body 2 which faces the chip carrier 3, and an electrically conducting supply layer 7, which is arranged on a side of the contact layer 6 facing away from the semiconductor body 2 and is connected to the first contact element 4. In addition, the semiconductor chip 2 comprises an insulation layer 8, which is arranged between the contact layer 6 and the supply layer 7. The semiconductor chip 1 also comprises a plurality of electrically conducting feed-through elements 9, which are embedded in the insulation layer 8 and electrically connect the supply layer 7 to the contact layer 6. The total number of feed-through elements 9 in a 1 mm$^2$-sized semiconductor chip 1 is between 50 and 70, in particular 60.

In the first exemplary embodiment, the feed-through elements 9 are arranged offset relative to each other in rows. At the same time, the size of the feed-through elements 9, that is, a first lateral extent a1 and/or a second lateral extent a2, increases in a row from the first side I to a second side II of the semiconductor body 2 opposite the first. On the other hand, the size of the feed-through elements 9 in a row barely changes at all or remains constant from a third side III to a fourth side IV of the semiconductor body 2 opposite the third side III. For example, the feed-through elements 9 near to the first contact element 4 can have a first and second lateral extent a1 and a2 from 0.2 μm inclusive to 0.5 μm inclusive, and further away from the first contact element 4 on the second side II of the semiconductor body 2 a first and second lateral extent a1 and a2 of around 3 μm. In the first exemplary embodiment, the feed-through elements 9 each have the geometrical shape of a cylinder, so that the first and second lateral extents a1 and a2 are of equal size. The feed-through elements 9 are in particular formed separately.

In operation, the series resistance of the feed-through elements 9 decreases from the first side I to the second side II of the semiconductor body 2, while the series resistance of the supply layer 9 increases from the first side I to the second side II of the semiconductor body 2. As a result, a relatively constant total series resistance and thus a homogeneous current density distribution can be achieved across the semiconductor chip 1. In other words, in operation there exists a plurality of current paths between the first and second contact element 4, 5, which for the most part have the same total series resistance which is between 0.1 and 0.65Ω. In this case, a current path extends from the first contact element 4 through the supply layer 7, through the feed-through element 9, through the contact layer 6 and through the semiconductor body 2 to the second contact element 5. The total series resistance along a current path is essentially composed of the various series resistances of the current-carrying layers or elements.

In particular, the semiconductor chip 1 is a high-current semiconductor chip which in normal operation has a current density of at least 4 A/mm$^2$, in particular at least 5 A/mm$^2$. The semiconductor chip 1 can have a forward voltage of 4.5 V+/−2 V and a peak current of 10 A.

The semiconductor body 2 has a first semiconductor region 20, a second semiconductor region 22 and an active zone 21 arranged between the first and second semiconductor region 20, 22. In addition, the semiconductor body 2 has a first main surface 2A and a second main surface 2B opposite the first main surface 2A, which bound the semiconductor body 2 in a vertical direction V. The semiconductor body 2 has a geometric shape that approximates to a frustum of a pyramid. In this regard, the semiconductor body 2 has a plurality of side faces 2C, 2D, 2E, 2F, each of which connects the first main surface 2A to the second main surface 2F. The side surfaces 2C, 2D, 2E, 2F are arranged largely transverse to the first and second main surface 2A, 2B and bound the semiconductor body 2 in several lateral directions L1, −L1, L2, −L2. Furthermore, the lateral surfaces 2C, 2D, 2E, 2F can each be a surface composed of at least two planar partial surfaces, whose surface normals are not parallel to each other.

In a non-limiting embodiment, the first semiconductor region 20 is a p-type conducting semiconductor region and the second semiconductor region 22 is an n-type conducting semiconductor region, each of which can comprise a layer sequence. The semiconductor regions 20, 21, 22, or layers, of the semiconductor body 2 contain at least one III-V semiconductor material, such as a material from the material systems In$_x$Ga$_y$Al$_{1-x-y}$P, In$_x$Ga$_y$Al$_{1-x-y}$N or In$_x$Ga$_y$Al$_{1-x-y}$As, in each case with 0≤x, y≤1 and x+y≤1. The growth substrate used for manufacture is at least partially removed, so that the chip carrier 3 is a substitute carrier.

The chip carrier 3 contains, for example, a metal, a semiconductor material or a ceramic material. The chip carrier can be electrically conducting or electrically insulating. Suitable materials for the chip carrier 3 are, for example, Si$_3$N$_4$ and AlN.

In a non-limiting embodiment, the optoelectronic semiconductor chip 1 is a radiation-emitting semiconductor chip, wherein radiation is generated in the active zone 21. In particular, in the operation of the semiconductor chip 1 the active zone 21 emits electromagnetic radiation, for example in the visible, ultraviolet or infra-red spectral range. A significant proportion of the radiation generated by the active zone 21 passes through the second main surface 2B of the semiconductor body 2B. The semiconductor body 2 advantageously has a roughening on the second main surface 2B, which allows the radiation emission extraction to be improved compared to a flat radiation emission surface. In addition, the second main surface 2B is advantageously uncovered by the contact elements 4, 5 arranged on the side of the semiconductor body 2, so that these cannot cause radiation losses at the second main surface 2B.

The contact elements 4, 5 are electrically conductive layers, in particular metallizations, which can be electrically contacted from the outside, for example by means of bond wires 10. In this case, the first contact element 4 can form a p-type contact and the second contact element 5 an n-type contact.

The contact layer 6 is made of an, in particular, highly reflective material, for example a metal such as silver or aluminum, or an electrically conductive oxide, such as ZnO. The contact layer 6 can be formed of a layer sequence of metal layers and conductive oxide layers. A thickness D1 of the contact layer is between 100 nm inclusive and 500 nm inclusive. In particular, the contact layer 6 has a uniform thickness D1 and is designed contiguously. The first semiconductor layer 20 is energized by means of the contact layer 6.

Furthermore, the semiconductor chip 1 has a current dispersion layer 11 arranged between the contact layer 6 and the insulation layer 8, the current dispersion layer 11 being in electrical contact with the contact layer 6, and completely covering the same. The current dispersion layer 11 is formed, for example, from a metal such as titanium, copper, nickel, gold, platinum, aluminum or silver. The current dispersion layer 11 can have an inhomogeneous thickness D2, wherein in regions in which it is connected to a feed-through element 9, in particular, it is formed thinner than in regions without a feed-through element 9.

Suitable materials for the insulation layer 8 are weakly electrically conducting or non-conducting materials, in particular silicon oxides or silicon nitrides. The thickness D3 of the insulation layer 8 is between 200 nm inclusive and 2 μm inclusive. The thickness 3 of the insulation layer 8 is greater in regions covered by the contact layer 6 with feed-through elements 9 than in regions without feed-through elements 9. By means of the insulation layer 8, some regions of the contact layer 6 are electrically insulated from the supply layer 7.

In addition to the feed-through elements 9, the supply layer 7 is also embedded in the insulation layer 8. The insulation layer extends in lateral directions L1, −L1, L2, −L2 across the semiconductor body 2. To produce the feed-through elements 9 or supply layer 7, the insulation layer 8 can be provided with openings in which an electrically conductive material is arranged, for example a metal such as Au. In this case, the feed-through elements 9 can be formed together with the supply layer 7 in one manufacturing step and therefore formed from the same material as the supply layer 7.

The supply layer 7 is electrically conductively connected to the first contact element 4 and is directly adjacent thereto. The thickness D4 of the supply layer 7 is between 200 nm inclusive and 1 μm inclusive, wherein the supply layer 7 is formed thicker close to the first contact element 4 than in regions covered by the semiconductor body 2.

Furthermore, the semiconductor chip 1 has a plurality of vias 12, each of which extends from the chip carrier 3 through the supply layer 7, through the insulation layer 8, through the contact layer 6 and the first semiconductor region 20 into the second semiconductor region 22. The vias 12 are each arranged in openings which extend through the supply layer 7, through the insulation layer 8, through the contact layer 6 and the first semiconductor region 20 into the second semiconductor region 22. On each of the side surfaces bordering the openings, a passivation layer 13 can be arranged, which laterally encloses the via 12. The vias 12 can be made from an electrically conductive material, for example from a metal such as silver. In a non-limiting embodiment, the feed-through elements 9 are arranged in spaces between the vias 12 (compare FIG. 2).

Furthermore, the semiconductor chip 1 has a connection layer 14 which electrically connects the second contact element 5 to the vias 12. The connection layer 14 is arranged on a side of the supply layer 7 facing away from the semiconductor body 2. The thickness D5 of the connection layer 14 has a value of, in particular, between 500 nm inclusive and 3 μm inclusive. In a non-limiting embodiment, the connection layer 14 is formed thicker than the supply layer 7 in broad regions. As a result, the fluctuations in the current density occurring on the n-side are negligibly small compared to the fluctuations present on the p-side.

The semiconductor chip 1, on a side of the connection layer 14 facing away from the semiconductor body 2, has a bonding layer 15 by means of which the semiconductor body 2 is indirectly mechanically connected to the chip carrier 3. The bonding layer 15 can be, for example, an adhesive layer or a solder layer.

A further current dispersion layer 16 can be arranged between the connection layer 14 and the bonding layer 15. The additional current dispersion layer 16 is an n-side current dispersion layer, which is in electrical contact with the connection layer 14. The additional current dispersion layer 16 extends in the same way as the connection layer 14 into the openings in which the vias 12 are arranged.

The chip carrier 3 can be provided with a metallization 17 on a side facing away from the semiconductor body 2. By way of the metallization 17, the semiconductor chip 1 can be connected on its rear side to a terminal carrier, for example, a printed circuit board.

On the front side, the semiconductor chip 1 has a first covering layer 18 and a second covering layer 19, the second covering layer 19 being arranged on a side of the first covering layer 18 facing away from the chip carrier 3. The covering layers 18, 19 are applied to the second main surface 2B and the side surfaces 2C, 2D, 2E, 2F of the semiconductor body 2 and extend up to regions of the chip carrier 3 uncovered by the semiconductor body 2. The first covering layer 18 is a layer containing or made of Al2O3. The second covering layer 19 is, in particular, an insulating layer of, for example, silicon oxide or silicon nitride or aluminum oxide, such as Al2O3. It is possible that the second covering layer 19 contains scattering particles and/or fluorescent particles. The semiconductor chip 2 is bounded on the front side by the second covering layer 19, wherein a frontal outer surface of the second covering layer 19 forms a predominant part of the frontal outer surface of the semiconductor chip 1. Also, the exposed contact surfaces of the contact elements 4, 5 form a part of the frontal outer surface of the semiconductor chip 1.

Figure 3:
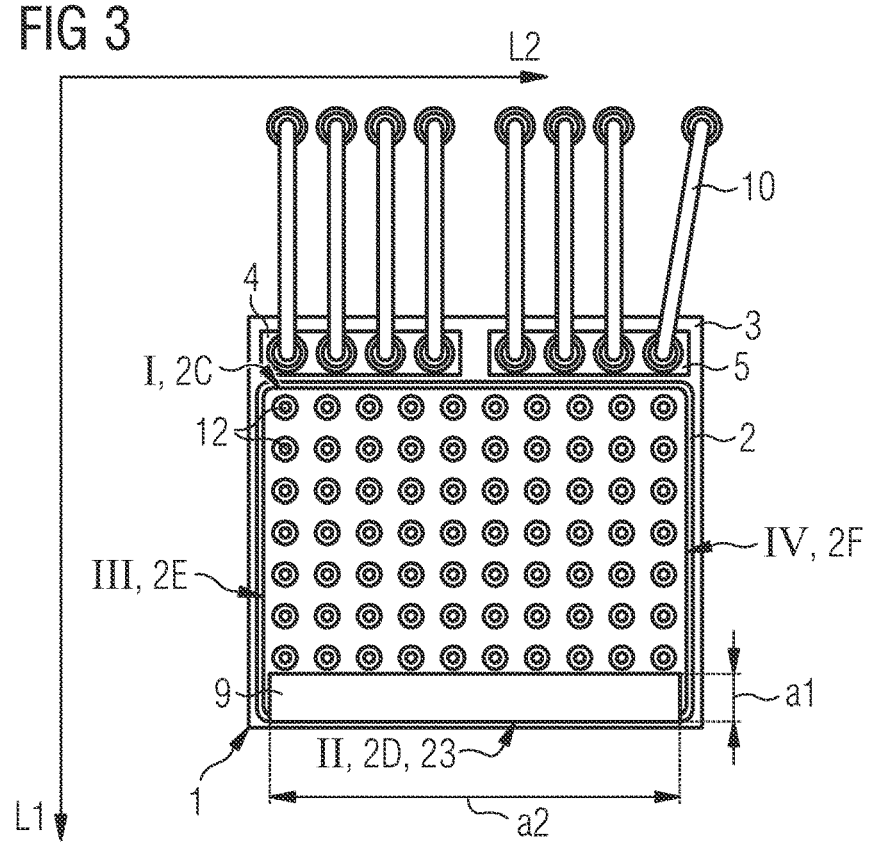

The semiconductor chip 1 shown in FIG. 3 has a similar structural design as the semiconductor chip 1 according to the first exemplary embodiment. Differences exist in the number and configuration of the feed-through elements 9. The semiconductor chip 1 according to the second exemplary embodiment shown in FIG. 3 has a single feed-through element 9 having a planar design, which is arranged on the second side II of the semiconductor body 2 and extends along a side edge 23 of the semiconductor body 2 bordering the first main surface. In this embodiment, the series resistance between the supply layer 7 and the contact layer 6 in operation decreases from the first to the second side of the semiconductor body 2. The feed-through element 9 is strip-shaped. A width or first lateral extent a1 of the feed-through element 9 is between 70 μm and 90 μm inclusive. The second lateral extent a2 corresponds, in particular, to the length of the side edge 23.

Figure 4:
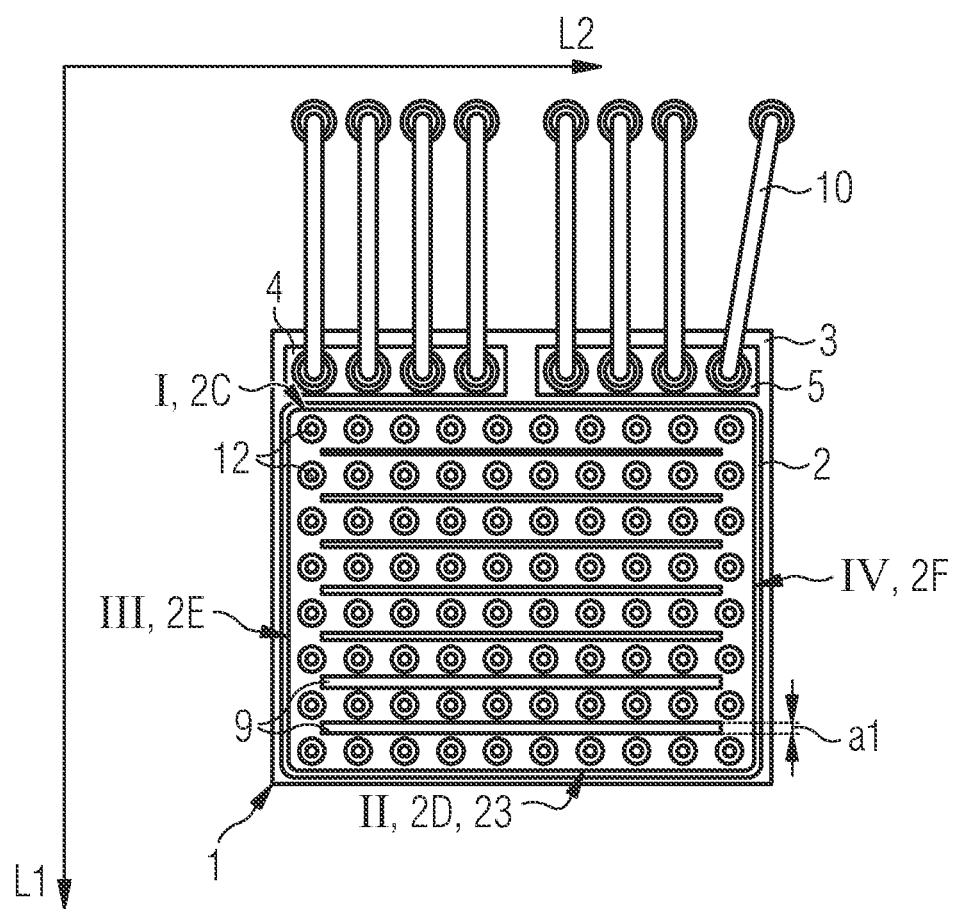

The semiconductor chip 1 shown in FIG. 4 in accordance with the third exemplary embodiment also has a similar structural design as the semiconductor chip 1 according to the first exemplary embodiment. Differences exist in the number and configuration of the feed-through elements 9. The semiconductor chip 1 has a plurality of strip-shaped feed-through elements 9, which each extend from the third side III to the fourth side IV of the semiconductor body 2. In other words, the strip-shaped feed-through elements 9 are arranged in the manner of a lattice and, in particular, parallel to the side edge 23. The feed-through elements 9 are arranged in spaces between the vias 12. The width or first lateral extent a1 of the feed-through elements 9 increases from the first side I to the second side II of the semiconductor body 2.

Figure 5:
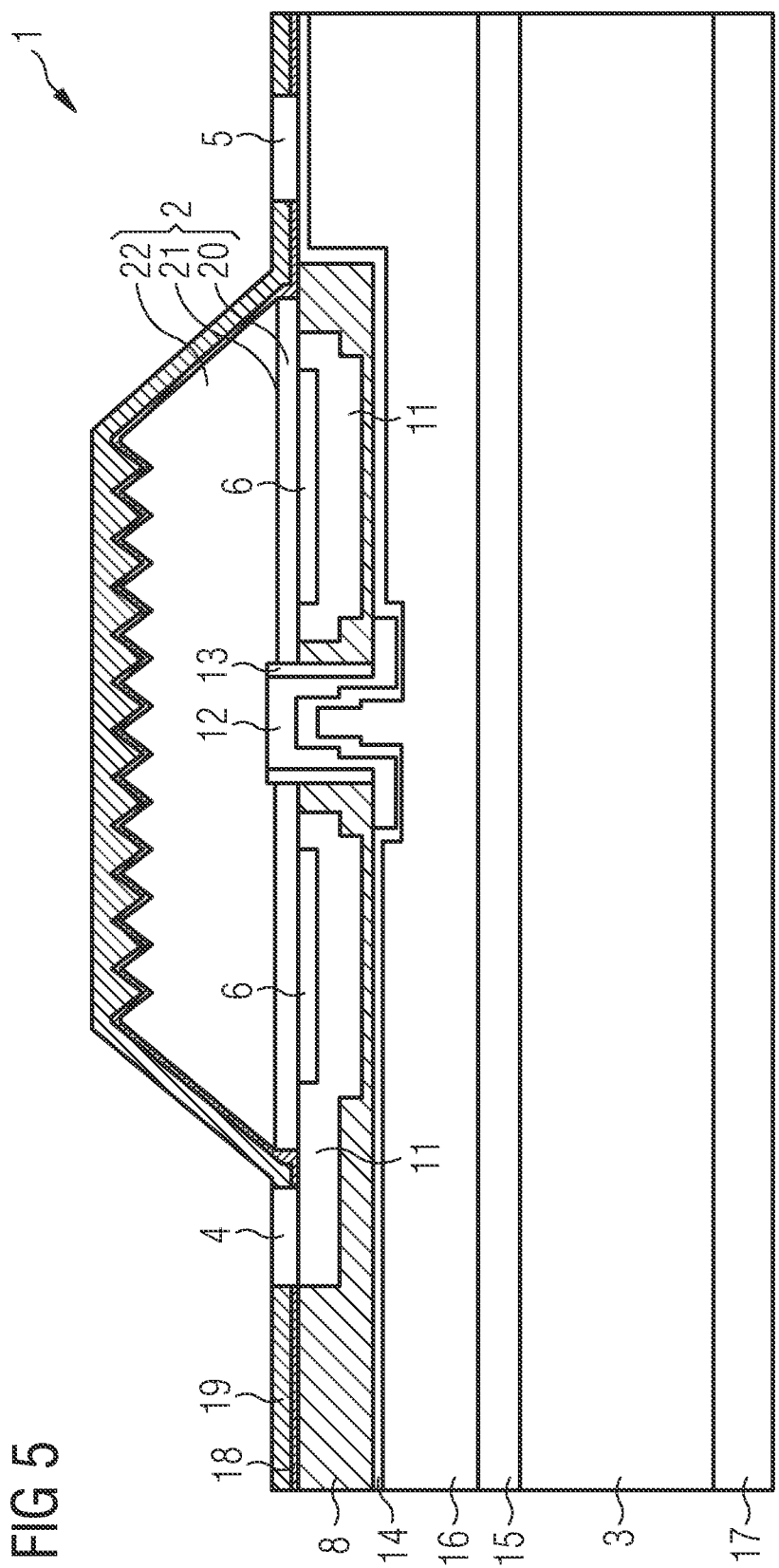
Figure 6:
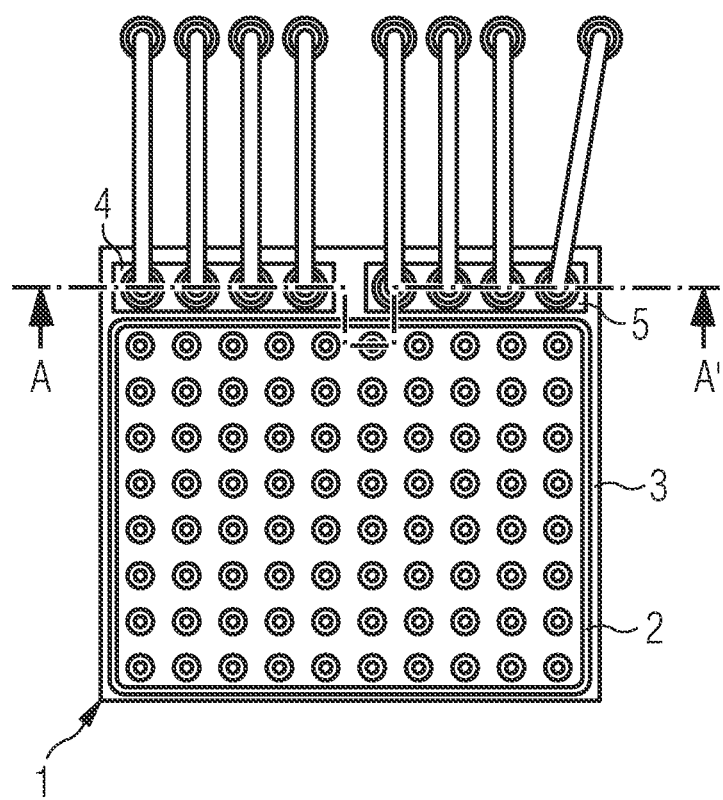

FIGS. 5 and 6 show a comparison example of a semiconductor chip 1, wherein the semiconductor chip 1 in FIG. 5 is shown in a sectional view along the cutting surface AA' shown in FIG. 6. The semiconductor chip 1 has a similar structural design as the semiconductor chips 1 according to the first, second and third exemplary embodiment. There are differences, however, with regard to the p-side contacting of the semiconductor body 2. The semiconductor chip 1 has no feed-through elements 9. Instead, the current is injected into the contact layer 6 through the current dispersion layer 11 arranged between the first contact element 4 and the contact layer 6, which for the most part has a homogeneous thickness across the semiconductor chip 1.

Figure 7:
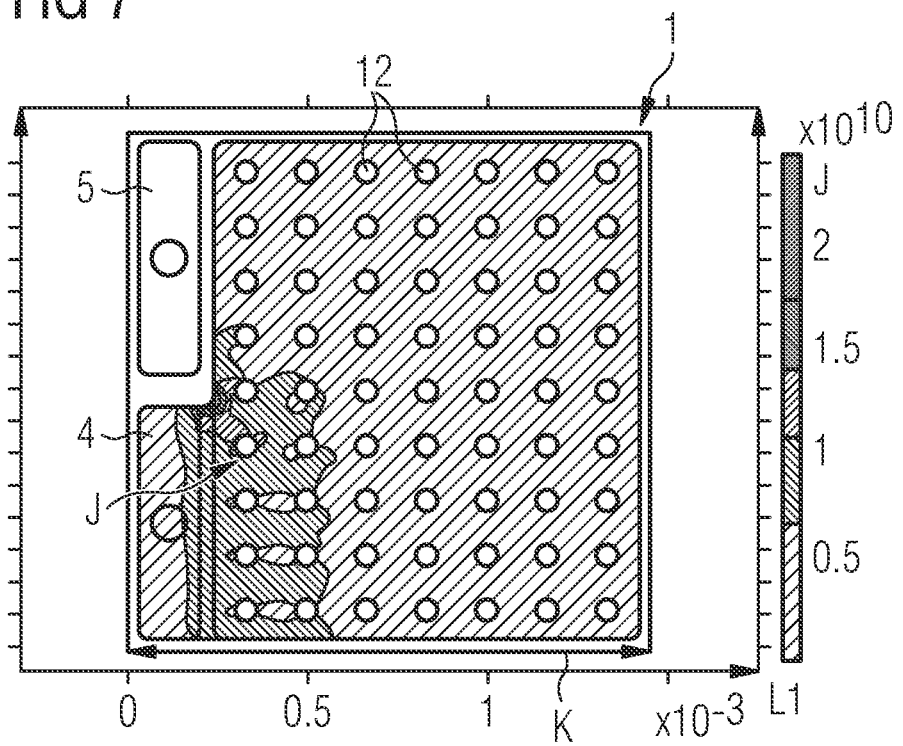

The diagram shown in FIG. 7 shows the current density distribution in the optoelectronic semiconductor chip 1 in accordance with the comparison example, wherein an edge length K of the semiconductor chip 1 in meters is plotted on the L1-axis. The current density J is indicated by hatching, the current density J increasing with the hatching density (see bar chart). The current density J is given in A/m2.

As the diagram shows, in the region indicated by the arrow near the first contact element 4, the current density J is higher than in the regions of the semiconductor chip 1 remote from the first contact element 4, which means that an inhomogeneous current density distribution exists in the vicinity of the p-type contact element 4 (so-called "current crowding"), which causes, for example, the intensity of the emitted radiation across the semiconductor chip 1 to fluctuate. This effect can be prevented in the semiconductor chips in accordance with the first, second and third exemplary embodiment.

Figure 8:
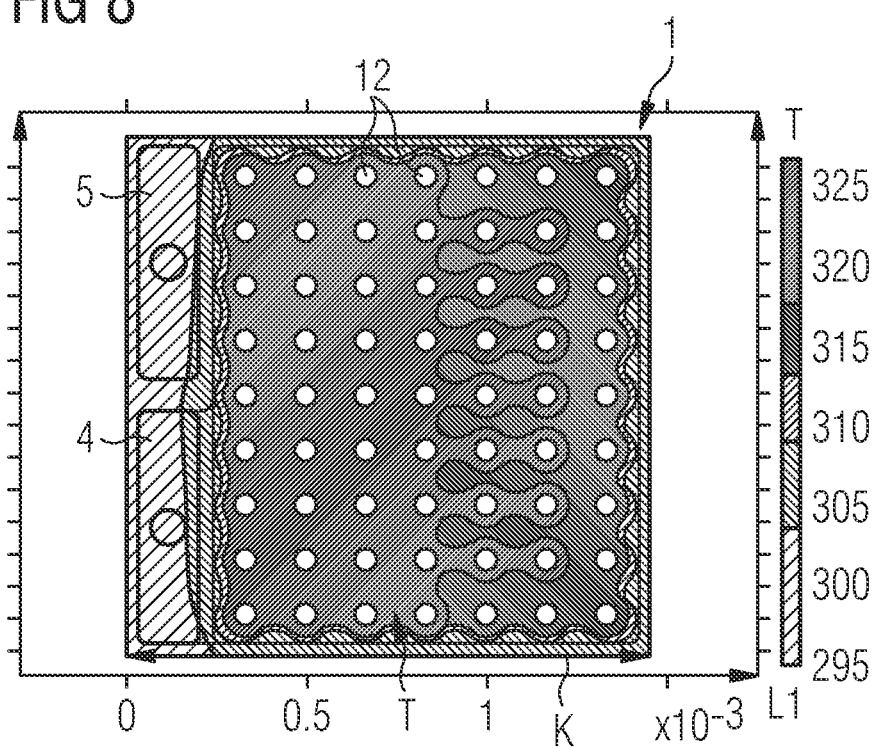

The diagram shown in FIG. 8 shows the temperature distribution in the optoelectronic semiconductor chip 1 in accordance with the comparison example, wherein the edge length K of the semiconductor chip 1 in meters is plotted on the L1-axis. The temperature is indicated by hatching, the temperature T increasing with the hatching density (compare bar chart). The temperature T is given in Kelvin.

As the diagram shows, in the region indicated by the arrow near the first contact element 4, the temperature T is higher than in the regions of the semiconductor chip 1 remote from the first contact element 4, which means that an inhomogeneous temperature distribution exists in the vicinity of the p-type contact element 4. This can lead to a disproportionately severe degradation of the semiconductor body 2. This effect can be prevented in the semiconductor chips 1 in accordance with the first, second and third exemplary embodiment.

The invention is not limited by the description based on the exemplary embodiments. Rather, the invention comprises each new feature, as well as any combination of features, which includes in particular every combination of features in the patent claims, even if this feature or this combination itself is not explicitly specified in the patent claims or exemplary embodiments.

LIST OF REFERENCE SIGNS 1 optoelectronic semiconductor chip
2 semiconductor body
2A first main surface of the semiconductor body
2B second main surface of the semiconductor body
2C, 2D, 2E, 2F side surface
3 chip carrier
4 first contact element
5 second contact element
6 contact layer
7 supply layer
8 insulation layer
9 feed-through element
10 bond wire
11 current dispersion layer
12 via
13 passivation layer
14 connection layer
15 bonding layer
16 current dispersion layer
17 metallization
18 first covering layer
19 second covering layer
20 first semiconductor region
21 active zone
22 second semiconductor region
23 side edge
I first side
II second side
III third side
IV fourth side
AA' cutting surface
a1 first lateral extent
a2 second lateral extent
D1, D2, D3, D4, D5 thickness
J current density
K edge length
L1, L2 lateral direction
T temperature

The invention claimed is:
1. An optoelectronic semiconductor chip comprising:
a semiconductor body comprising a first semiconductor region and a second semiconductor region;
a first and second contact element configured to electrically contact the semiconductor body;
a chip carrier where the semiconductor body and the first contact element and the second contact element are arranged thereon; wherein the semiconductor body and the first contact element and the second contact element are arranged next to each other, the first contact element and the second contact element being arranged on a first side of the semiconductor body;
an electrically conducting contact layer arranged on a first main surface of the semiconductor body, said first main surface facing the chip carrier;
an electrically conducting supply layer arranged on the side of the electrically conducting contact layer facing away from the semiconductor body; wherein the electrically conducting supply layer is connected to the first contact element;
an insulation layer arranged between the electrically conducting contact layer and the electrically conducting supply layer; wherein the insulation layer electrically insulates the electrically conducting contact layer from the electrically conducting supply layer; and at least one electrically conductive feed-through element embedded in the insulation layer and electrically connecting the electrically conducting supply layer to the electrically conducting contact layer, wherein a quantity and/or size of the at least one electrically conductive feed-through elements is greater on a second side of the semiconductor body opposite the first side than on the first side, wherein the at least one electrically conductive feed-through element comprises a same material as the electrically conductive supply layer.

2. The optoelectronic semiconductor chip as claimed in claim 1, wherein the electrically conducting supply layer is a contiguous layer with largely homogeneous thickness.

3. The optoelectronic semiconductor chip as claimed in claim 1, wherein the electrically conducting contact layer is a contiguous layer of homogeneous thickness.

4. The optoelectronic semiconductor chip as claimed in claim 1, wherein the at least one feed-through element has the geometrical shape of a cylinder or prism.

5. The optoelectronic semiconductor chip as claimed in claim 1, wherein the at least one electrically conductive feed-through element comprises a plurality of electrically conductive feed-through elements arranged offset from each other in rows, the size of the plurality of electrically conductive feed-through elements in a row increasing from the first to the second side of the semiconductor body.

6. The optoelectronic semiconductor chip as claimed in claim 1, wherein the at least one electrically conductive feed-through element comprises a plurality of electrically conductive feed-through elements arranged offset from each other in rows, the size of the plurality of electrically conductive feed-through elements in a row being constant from a third side to a fourth side of the semiconductor body opposite the third side.

7. The optoelectronic semiconductor chip as claimed in claim 1, wherein the at least one electrically conductive feed-through element consists of a single feed-through element with a planar design arranged on the second side of the semiconductor body; and wherein the single feed-through element extends along a side edge of the semiconductor body bordering the first main surface.

8. The optoelectronic semiconductor chip as claimed in claim 7, wherein the feed-through element has a strip-like design.

9. The optoelectronic semiconductor chip as claimed in claim 1, wherein the at least one electrically conductive feed-through element comprises a plurality of electrically conductive strip-shaped feed-through elements that extend from a third side to a fourth side of the semiconductor body opposite the third side, a width of the plurality of feed-through elements increasing from the first side to the second side of the semiconductor body.

10. The optoelectronic semiconductor chip as claimed in claim 9, further comprising a plurality of vias where each via of the plurality of vias extends from the chip carrier through the electrically conducting supply layer, through the insulation layer, through the electrically conducting contact layer and the first semiconductor region into the second semiconductor region.

11. The optoelectronic semiconductor chip as claimed in claim 10, further comprising a connection layer electrically connecting the second contact element to the plurality of vias.

12. The optoelectronic semiconductor chip as claimed in claim 11, wherein the connection layer comprises a thickness greater than a thickness of the electrically conducting supply layer.

13. The optoelectronic semiconductor chip as claimed in claim 10, the feed-through elements being arranged in the spaces between the plurality of vias.

14. The optoelectronic semiconductor chip as claimed in claim 1, the at least one electrically conductive feed-through element comprises the same material as the electrically conducting supply layer.

15. The optoelectronic semiconductor chip as claimed in claim 1, wherein the insulation layer comprises a multi-layer structure with at least two sublayers of different types.

16. The optoelectronic semiconductor chip as claimed in claim 1, wherein the supply layer comprises a metal.

17. The optoelectronic semiconductor chip as claimed in claim 1, wherein the supply layer consists of a metal.

18. The optoelectronic semiconductor chip as claimed in claim 1, wherein the insulation layer is arranged within the supply layer.

* * * * *